US012701827B2

(12) United States Patent
Cheng et al.

(10) Patent No.: US 12,701,827 B2
(45) Date of Patent: Aug. 4, 2026

(54) SEMICONDUCTOR STRUCTURES WITH ADJUSTABLE LIGHT-EMITTING WAVELENGTHS AND MANUFACTURING METHODS THEREOF

(71) Applicant: ENKRIS SEMICONDUCTOR, INC., Suzhou (CN)

(72) Inventors: Kai Cheng, Suzhou (CN); Liyang Zhang, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 391 days.

(21) Appl. No.: 18/549,479

(22) PCT Filed: Apr. 15, 2021

(86) PCT No.: PCT/CN2021/087487
§ 371 (c)(1),
(2) Date: Sep. 7, 2023

(87) PCT Pub. No.: WO2022/217539
PCT Pub. Date: Oct. 20, 2022

(65) Prior Publication Data
US 2024/0154063 A1 May 9, 2024

(51) Int. Cl.
H10H 20/825 (2025.01)
H10H 20/01 (2025.01)
(Continued)

(52) U.S. Cl.
CPC .... H10H 20/825 (2025.01); H10H 20/01335 (2025.01); H10H 20/811 (2025.01); H10H 20/819 (2025.01); H10H 20/824 (2025.01)

(58) Field of Classification Search
CPC .......... H10H 20/825; H10H 20/01335; H10H 20/819; H10H 20/824; H10H 20/821;
(Continued)

(56) References Cited

U.S. PATENT DOCUMENTS 7,956,370 B2 * 6/2011 Pan ........................ B82Y 20/00
257/14
9,281,446 B2 3/2016 Suh et al.
(Continued)

FOREIGN PATENT DOCUMENTS

CN 101651181 B * 6/2011 ........... H10H 20/821
CN 103000776 A 3/2013
(Continued)

OTHER PUBLICATIONS

ISA State Intellectual Property Office of the People's Republic of China, International Search Report Issued in Application No. PCT/CN2021/087487, Jan. 27, 2022, WIPO, 4 pages.
(Continued)

*Primary Examiner* — Mamadou L Diallo
(74) *Attorney, Agent, or Firm* — Carroll, Hoette & Butscher, LLC; Christopher R. Carroll

(57) ABSTRACT

The present disclosure provides a semiconductor structure and a manufacturing method thereof. The semiconductor structure includes: a silicon substrate having several through-silicon-vias therein; a first semiconductor layer located in each through-silicon-via and on the silicon substrate, an active layer located on the first semiconductor layer, and a second semiconductor layer located on the active layer, where a conductivity type of the second semiconductor layer is opposite to that of the first semiconductor layer, a material of the first semiconductor layer a group III nitride, a material of the active layer a group III nitride, and a material of the second semiconductor layer include a group III nitride.

18 Claims, 6 Drawing Sheets

(51) Int. Cl.
　　*H10H 20/811*　　(2025.01)
　　*H10H 20/819*　　(2025.01)
　　*H10H 20/824*　　(2025.01)
(58) Field of Classification Search
　　CPC ......... H01L 21/02576; H01L 21/02579; H01L
　　　　　　21/02458; H01L 21/02505; H01L
　　　　　21/0254; H01L 21/02639; H01L 21/02647
　　See application file for complete search history.

(56)　　　　　　References Cited

U.S. PATENT DOCUMENTS

| | | | |
|---|---|---|---|
| 2009/0032799 A1* | 2/2009 | Pan ...................... | H10H 20/821 |
| | | | 257/E33.023 |
| 2010/0006894 A1* | 1/2010 | Ohta .................... | H10D 62/824 |
| | | | 257/E29.091 |
| 2011/0114983 A1* | 5/2011 | Tu ....................... | H01L 21/0254 |
| | | | 257/E33.023 |
| 2015/0076446 A1 | 3/2015 | Suh et al. | |
| 2016/0111501 A1 | 4/2016 | Chen et al. | |
| 2018/0114726 A1* | 4/2018 | Odnoblyudov ........ | H10D 84/85 |

FOREIGN PATENT DOCUMENTS

| | | | | | |
|---|---|---|---|---|---|
| CN | 103681795 A | * | 3/2014 | ....... | H01L 21/02636 |
| CN | 103765592 A | | 4/2014 | | |
| CN | 104170100 A | | 11/2014 | | |
| CN | 108352412 A | | 7/2018 | | |
| WO | 2012115541 A2 | | 8/2012 | | |

OTHER PUBLICATIONS

ISA State Intellectual Property Office of the People's Republic of China, Written Opinion of the International Searching Authority Issued in Application No. PCT/CN2021/087487, Jan. 27, 2022, WIPO, 6 pages.(Submitted with Machine/ Partial Translation).

TW Patent Office, Office Action Issued in Application No. 111113418, Jul. 10, 2023, 8 pages.(Submitted with Machine/Partial Translation).

* cited by examiner

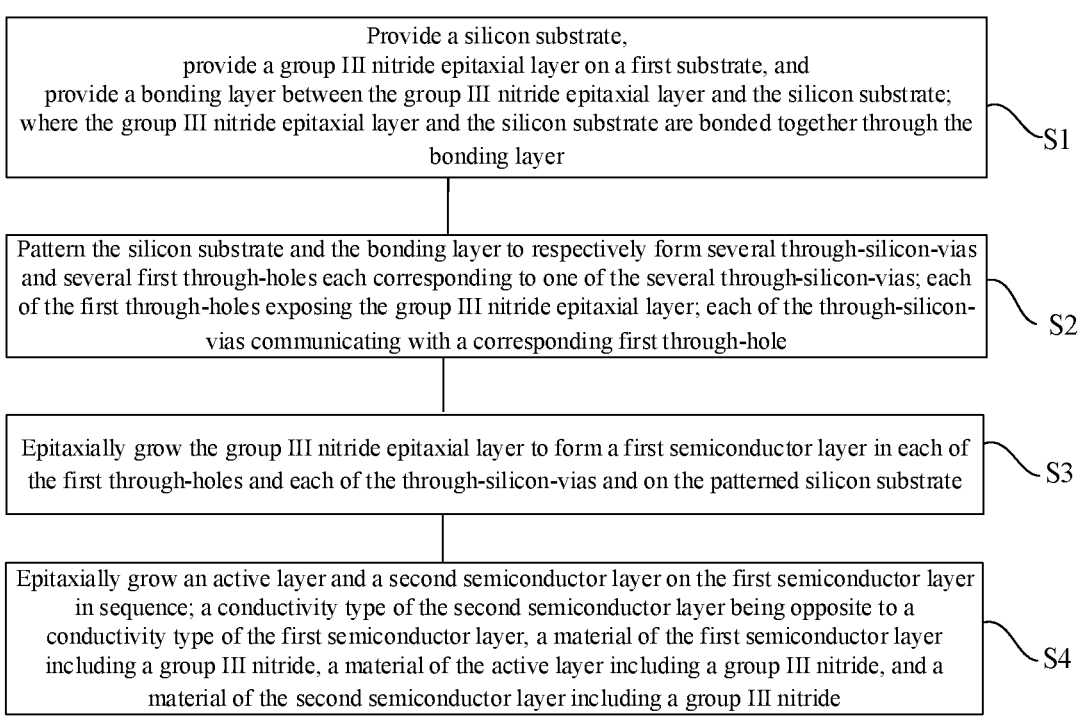

| Provide a silicon substrate, provide a group III nitride epitaxial layer on a first substrate, and provide a bonding layer between the group III nitride epitaxial layer and the silicon substrate; where the group III nitride epitaxial layer and the silicon substrate are bonded together through the bonding layer | S1 |

Pattern the silicon substrate and the bonding layer to respectively form several through-silicon-vias and several first through-holes each corresponding to one of the several through-silicon-vias; each of the first through-holes exposing the group III nitride epitaxial layer; each of the through-silicon-vias communicating with a corresponding first through-hole — S2

Epitaxially grow the group III nitride epitaxial layer to form a first semiconductor layer in each of the first through-holes and each of the through-silicon-vias and on the patterned silicon substrate — S3

Epitaxially grow an active layer and a second semiconductor layer on the first semiconductor layer in sequence; a conductivity type of the second semiconductor layer being opposite to a conductivity type of the first semiconductor layer, a material of the first semiconductor layer including a group III nitride, a material of the active layer including a group III nitride, and a material of the second semiconductor layer including a group III nitride — S4

FIG. 1

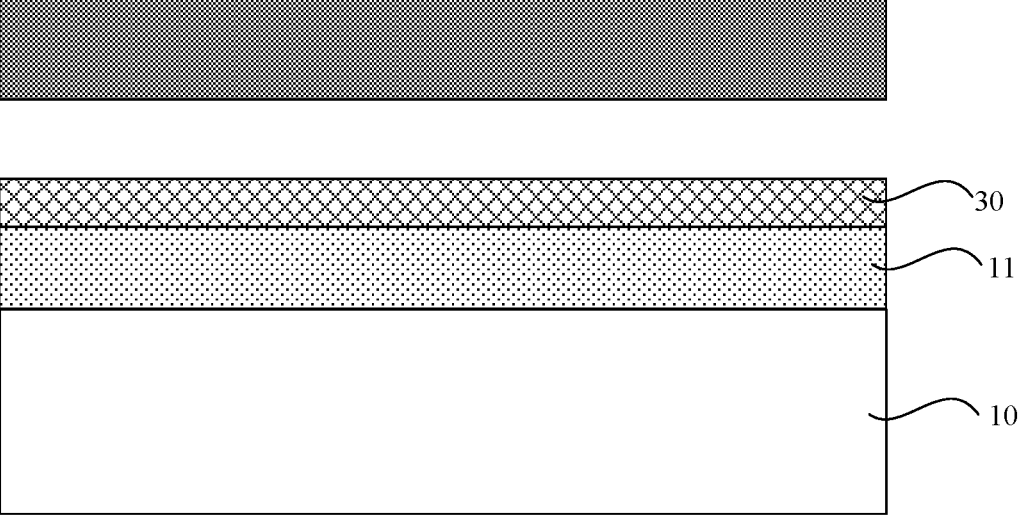

SEMICONDUCTOR STRUCTURES WITH ADJUSTABLE LIGHT-EMITTING WAVELENGTHS AND MANUFACTURING METHODS THEREOF

CROSS REFERENCE TO RELATED APPLICATION

This application is a US National Phase of a PCT Application No. PCT/CN2021/087487, filed on Apr. 15, 2021, the contents of which are incorporated herein by reference in its entirety.

TECHNICAL FIELD

The present disclosure relates to the field of semiconductor technology, and in particular, to semiconductor structures and manufacturing methods thereof.

BACKGROUND

Group III nitrides are new semiconductor materials of third generation after the first- and second-generation semiconductor materials such as silicon (Si) and GaAs. The group III nitrides have many advantages such as high saturation drift speed, high breakdown voltage, and excellent carrier transport performance. In view of this, group III nitride materials and semiconductor devices have been extensively and deeply studied in recent years, and using Metal-organic Chemical Vapor Deposition (MOCVD) technology to grow group III nitride materials is becoming more and more mature; in a research of semiconductor devices, the research on optoelectronic devices such as Light Emitting Diode (LED) and Laser Diodes (LDS) of group III nitrides and microelectronic devices such as High Electron Mobility Transistor (HEMT) of group III nitrides has achieved remarkable achievements and great progress.

With the gradual deepening of the application of group III nitride materials in LED display devices, an LED structure with good color rendering and freely adjustable light-emitting wavelength is urgently needed for terminal products.

SUMMARY

An object of the present disclosure is to provide a semiconductor structure and a manufacturing method thereof, which can meet requirements for good color rendering properties and freely adjustable light-emitting wavelengths of an LED in an industry.

To achieve the object, a first aspect of the present disclosure provides a semiconductor structure.

a silicon substrate, provided with one or more through-silicon-vias in the silicon substrate;

a first semiconductor layer located in each of the one or more through-silicon-vias and on the silicon substrate, an active layer located on the first semiconductor layer, and a second semiconductor layer located on the active layer, where a conductivity type of the second semiconductor layer is opposite to a conductivity type of the first semiconductor layer, a material of the first semiconductor layer includes a group III nitride, a material of the active layer includes a group III nitride, and a material of the second semiconductor layer include a group III nitride.

In some embodiments, the active layer is located on a top surface of the first semiconductor layer.

In some embodiments, the active layer includes an indium (In) element; the smaller a size of the top surface of the first semiconductor layer is, the greater a composition ratio of the indium element in the active layer is; the larger the size the top surface of the first semiconductor layer is, the less the composition ratio of the indium element in the active layer is.

In some embodiments, a dielectric layer is disposed between the first semiconductor layer and an upper surface of the silicon substrate.

In some embodiments, a sidewall of the through-silicon-via has the dielectric layer.

In some embodiments, the active layer is located on a top surface and a side surface of the first semiconductor layer.

In some embodiments, the active layer includes an indium element; an angle between the side surface and the top surface ranges from 40° to 70°; a composition ratio of the indium element in the active layer located on the top surface is greater than a composition ratio of the indium element in the active layer located on the side surface.

In some embodiments, a cross section of the first semiconductor layer along a thickness direction is triangular, and the active layer is located on the side surface of the first semiconductor layer.

In some embodiments, a material of the dielectric layer includes at least one of a silicon dioxide, a silicon nitride, or an aluminum oxide.

In some embodiments, a depth-to-width ratio of each of the one or more through-silicon-vias is greater than 1:1.

In some embodiments, there are a plurality of through-silicon-vias, and an arrangement of the active layer located on the first semiconductor layer in at least one of the plurality of through-silicon-vias is different from an arrangement of the active layer located on the first semiconductor layer in other of the plurality of through-silicon-vias.

In some embodiments, there are a plurality of through-silicon-vias, a common electrode is provided on a side of the silicon substrate away from the second semiconductor layer, and the common electrode is electrically coupled with the first semiconductor layer in each of the plurality of the through-silicon-vias.

In some embodiments, the semiconductor structure further includes: a group III nitride epitaxial layer located on a first substrate, a bonding layer bonding the group III nitride epitaxial layer and the silicon substrate, one or more first through-holes provided in the bonding layer, each of the one or more first through-holes communicating with a corresponding through-silicon-via, the first semiconductor layer being located in the one or more first through-holes to connect with the group III nitride epitaxial layer.

In some embodiments, there are a plurality of through-silicon-vias and a plurality of first through-holes respectively, a common electrode is provided on a sidewall of the silicon substrate and/or a sidewall of the group III nitride epitaxial layer, and the common electrode is electrically coupled with the first semiconductor layer in each of the plurality of through-silicon-vias.

In some embodiments, a material of the first substrate includes at least one of a sapphire, a silicon carbide, or a silicon.

In some embodiments, a material of the bonding layer includes silicon dioxide or silicon nitride.

A second aspect of the present disclosure provides a method of manufacturing a semiconductor structure, including:

providing a silicon substrate, providing a group III nitride epitaxial layer located on a first substrate, and providing a bonding layer between the group III nitride epitaxial layer and the silicon substrate; the group III nitride epitaxial layer and the silicon substrate being bonded together through the bonding layer;

patterning the silicon substrate and the bonding layer to respectively form one or more through-silicon-vias and one or more first through-holes each corresponding to one of the one or more through-silicon-vias, each of the one or more first through-holes exposing the group III nitride epitaxial layer; each of the one or more through-silicon-vias communicating with a corresponding first through-hole;

epitaxially growing the group III nitride epitaxial layer to form a first semiconductor layer in each of the one or more first through-holes and each of the one or more through-silicon-vias and on the patterned silicon substrate; and epitaxially growing an active layer and a second semiconductor layer on the first semiconductor layer in sequence, a conductivity type of the second semiconductor layer being opposite to a conductivity type of the first semiconductor layer, a material of the first semiconductor layer including a group III nitride, a material of the active layer including a group III nitride, and a material of the second semiconductor layer including a group III nitride.

In some embodiments, the active layer is formed on a top surface of the first semiconductor layer by etching or using a mask layer.

In some embodiments, the active layer includes an indium (In) element; the smaller a size of the top surface of the first semiconductor layer is, the greater a composition ratio of the indium element in the active layer is; the larger the size the top surface of the first semiconductor layer is, the less the composition ratio of the indium element in the active layer is.

In some embodiments, before epitaxial growing the first semiconductor layer, a patterned dielectric layer is formed on the patterned silicon substrate.

In some embodiments, before the silicon substrate is patterned to form the one or more through-silicon-vias, a dielectric layer is formed on a side of the silicon substrate away from the group III nitride epitaxial layer; the dielectric layer and the silicon substrate are patterned in a same process, or the dielectric layer is first patterned, and then the silicon substrate is etched by using the patterned dielectric layer as a mask.

In some embodiments, the dielectric layer is also formed on sidewalls of the one or more through-silicon-vias.

In some embodiments, the active layer is formed on a top surface and a side surface of the first semiconductor layer.

In some embodiments, the active layer includes an indium element; an angle between the side surface and the top surface ranges from 40° to 70°; a composition ratio of the indium element in the active layer located on the top surface is greater than a composition ratio of the indium element in the active layer located on the side surface.

In some embodiments, a cross section of the first semiconductor layer along a thickness direction is triangular, and the active layer is formed on the side surface of the first semiconductor layer.

In some embodiments, the manufacturing method further includes: etching the bonding layer to peel off the group III nitride epitaxial layer from the silicon substrate.

Compared with the related art, the present disclosure has the following beneficial effects.

1) The silicon substrate is bonded on the group III nitride epitaxial layer; using the mature process of the silicon substrate and its relatively thick thickness, the depth-to-width ratio of the silicon through via formed in the silicon substrate is generally large; when the group III nitride epitaxial layer is epitaxially grown to form the first semiconductor layer, dislocation extension in the first semiconductor layer is limited, and a probability of dislocations annihilating in the interior and sidewall of the through-silicon-via is increased, therefore, the first semiconductor layer, the active layer and the second semiconductor layer with low dislocation density can be formed, and the color rendering of the LED structure is improved.

2) In some embodiments, the depth-to-width ratio of the through-silicon-via is greater than 1:1. The depth-to-width ratio can further limit the extension of dislocations in the first semiconductor layer, and increase the probability of the dislocations annihilating in the interior and sidewall of the through-silicon-via.

3) In some embodiments, the active layer is located on the top surface of the first semiconductor layer. In this embodiment, the active layer can include a wavelength-sensitive element such as an indium (In) element. By controlling the depth-to-width ratio of the through-silicon-via to be different, the sizes of the top surfaces of the first semiconductor layers epitaxially grown in corresponding through-silicon-vias are different. Therefore, composition ratios of the wavelength-sensitive element such as the indium element in the active layers epitaxially grown on the corresponding first semiconductor layers are different, and the light emitting wavelengths of the LED structure are different. In this embodiment, the smaller the size of the top surface of the first semiconductor layer is, the greater the composition ratio of the indium element in the active layer is, and the longer the emitting wavelength of the LED structure is; the larger the size of the top surface of the first semiconductor layer is, the less the composition ratio of the indium element in the active layer is, the shorter the light emitting wavelength of the LED structure is.

4) In some embodiments, the active layer is located on the top surface and the side surface of the first semiconductor layer. In this embodiment, conditions of the epitaxial growth process can be controlled so that the angle between the side surface and the top surface of the first semiconductor layer ranges from 40° to 70°. Because the top surface is a (0001) crystal plane, a doping efficiency of the indium element in the active layer located on the top surface is greater than a doping efficiency of the indium element in the active layer located on the semipolar surface of the side surface, therefore, the composition ratio of the indium element in the active layer located on the top surface is larger than the composition ratio of the indium element in the active layer located on the side surface. The greater the composition ratio of the indium element is, the longer the corresponding light emitting wavelength is.

5) In some embodiments, the active layer is located on the side surface of the first semiconductor layer. In this embodiment, the conditions of the epitaxial growth process can be controlled to make the angle between the side surface of the first semiconductor layer and the upper surface of the silicon substrate range from 40° to 70°.

5
6

BRIEF DESCRIPTION OF THE DRAWINGS

FIG. 1 is a flowchart of a method of manufacturing a semiconductor structure according to a first embodiment of the present disclosure;

FIG. 2 to FIG. 6 are schematic views illustrating intermediate structures corresponding to processes of FIG. 1;

Figure 3:
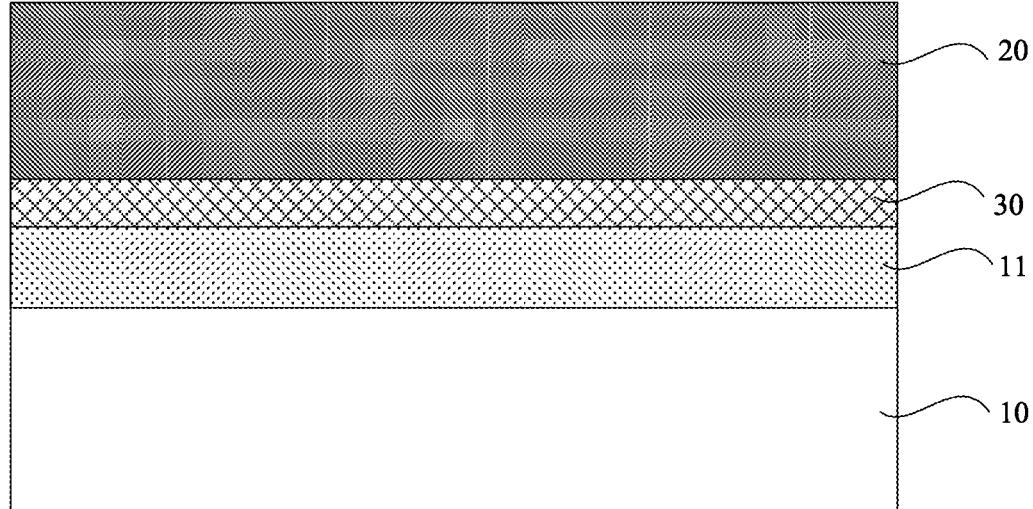

To facilitate the understanding of the present disclosure, all reference numerals appearing in the present disclosure are listed below:

| | |
|---|---|
| semiconductor structures 1, 2, 3, 4, 5 | first substrate 10 |
| group III nitride epitaxial layer 11 | dielectric layer 12 |
| silicon substrate 20 | through-silicon-via 20a |
| bonding layer 30 | first through-hole 30a |
| first semiconductor layer 41 | active layer 42 |
| second semiconductor layer 43 | cover mask plate 50 |
| opening 50a | |

DETAILED DESCRIPTION OF THE EMBODIMENTS

To make the above objects, features and advantages of the present disclosure more apparent and understandable, embodiments of the present disclosure will be described in detail below with reference to accompanying drawings.

Figure 5:
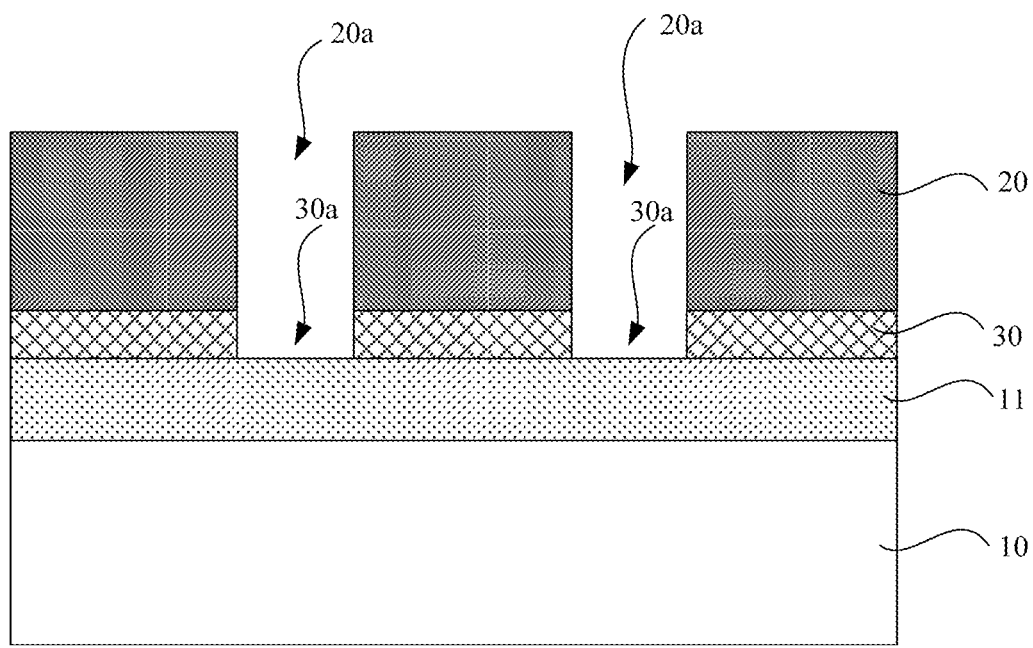
Figure 6:
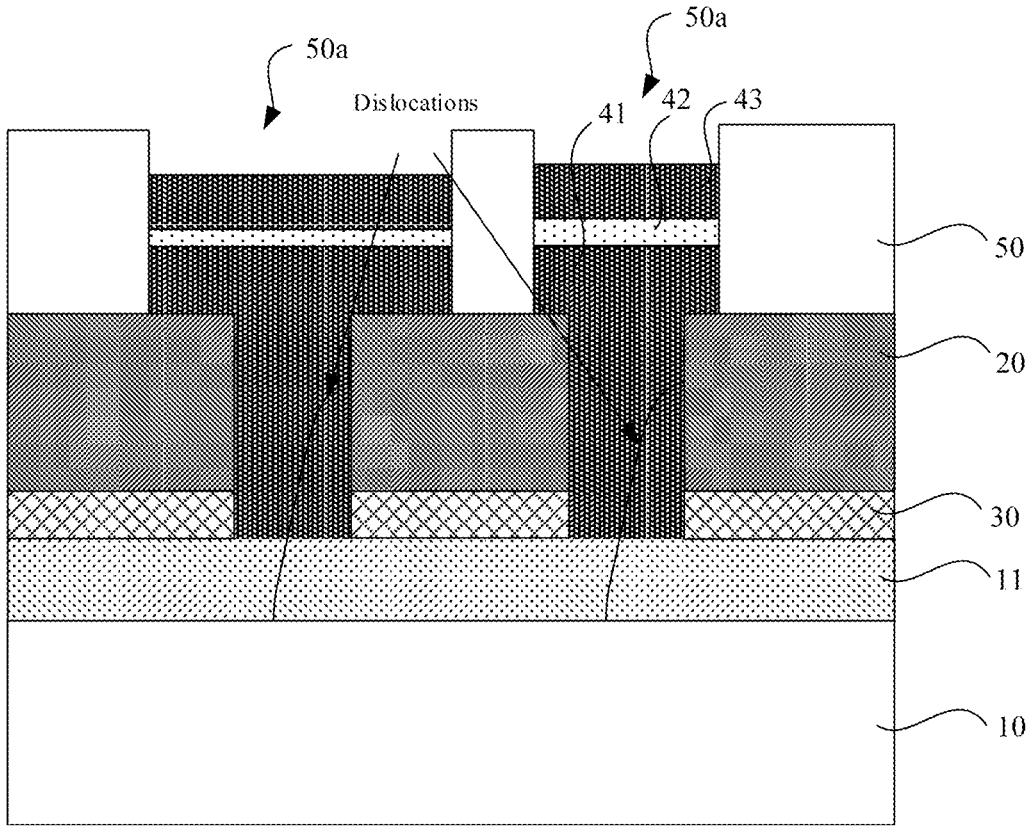
Figure 7:
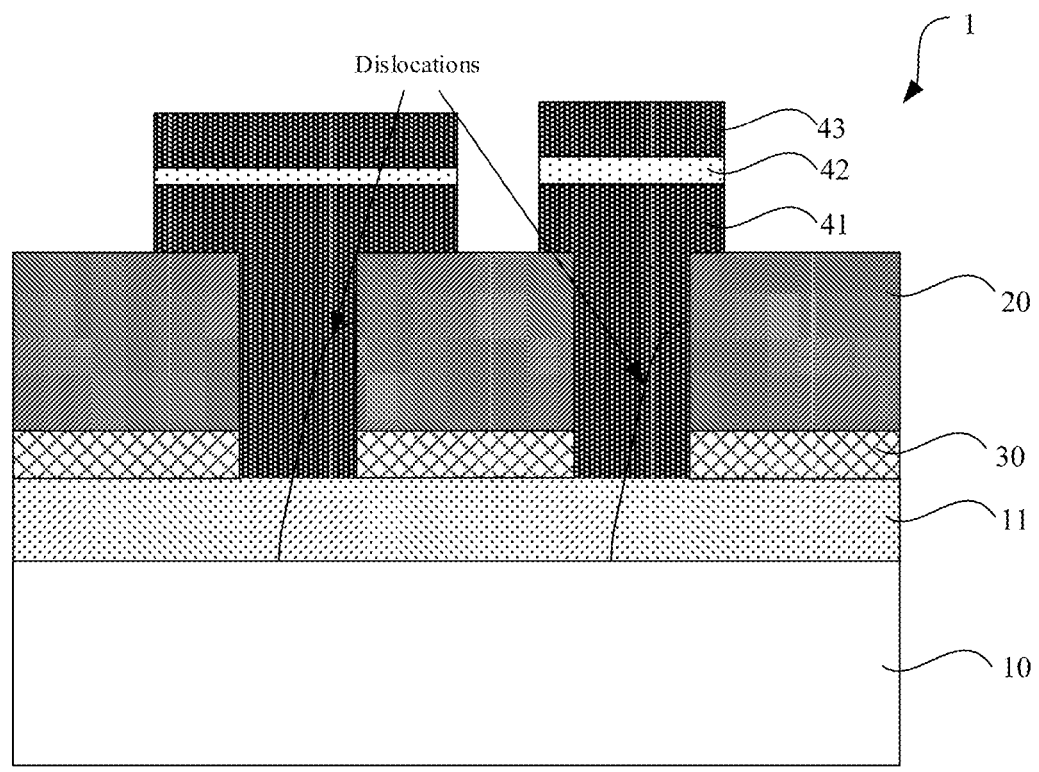
FIG. 7 is a cross-sectional structural diagram of a semiconductor structure according to a first embodiment of the present disclosure.

FIG. 1 is a flowchart of a method of manufacturing a semiconductor structure according to a first embodiment of the present disclosure; and FIG. 2 to FIG. 6 are schematic views illustrating intermediate structures corresponding to the processes of FIG. 1; and FIG. 7 is a cross-sectional structural diagram of a semiconductor structure according to a first embodiment of the present disclosure.

First, referring to step S1 in FIG. 1 and FIG. 2, a silicon substrate 20 is provided, a group III nitride epitaxial layer 11 is provided on a first substrate 10, and a bonding layer 30 is provided between the group III nitride epitaxial layer 11 and the silicon substrate 20; as shown in FIG. 3, the group III nitride epitaxial layer 11 and the silicon substrate 20 are bonded together through the bonding layer 30.

The first substrate 10 can include at least one of sapphire, silicon carbide, or silicon; or at least one of sapphire, silicon carbide, or silicon, and a group III nitride material disposed thereon; which is not limited in this embodiment.

A material of the group III nitride epitaxial layer 11 can include at least one of GaN, AlGaN, InGaN, or AlInGaN.

In this embodiment, it is noted that a chemical element represents a certain material, but molar ratios of respective chemical elements in a material are not limited. For example, a GaN material include a gallium (Ga) element and a nitrogen (N) element, but a molar ratio of the gallium element to the nitrogen element is not limited; an AlGaN material includes aluminum, gallium and nitrogen elements, but respective molar ratios of the three elements are not limited.

The group III nitride epitaxial layer 11 has dislocations, and the dislocations are mainly linear dislocations in crystal orientation, for example, dislocations extending in a thickness direction of the group III nitride epitaxial layer 11.

The silicon substrate 20 can include monocrystalline silicon with <100> orientation, monocrystalline silicon with <110> orientation, monocrystalline silicon with <111> orientation, or the like.

In this embodiment, as shown in FIG. 2, the bonding layer 30 is formed on the group III nitride epitaxial layer 11. A material of the bonding layer 30 can include a silicon nitride or a silicon dioxide, and the bonding layer 30 can be formed by physical vapor deposition or chemical vapor deposition, for example.

In another embodiment, the bonding layer 30 is formed on the silicon substrate 20, or the bonding layer 30 is formed on both the silicon substrate 20 and the group III nitride epitaxial layer 11.

In yet another embodiment, the bonding layer 30 can be provided separately, for example, the bonding layer 30 is neither formed on the silicon substrate 20 nor formed on the group III nitride epitaxial layer 11. A material of the bonding layer 30 can include metal.

A thickness of the bonding layer 30 can range from 0.01 μm to 2 μm.

The group III nitride epitaxial layer 11 and the silicon substrate 20 can be bonded together through high temperature and high pressure; it is also possible to apply a positive voltage to one of the group III nitride epitaxial layer 11 and the silicon substrate 20, and apply a negative voltage to the other, and then bond the group III nitride epitaxial layer 11 and the silicon substrate 20 together.

During the bonding process, the first substrate 10 can support the group III nitride epitaxial layer 11.

Figure 4:
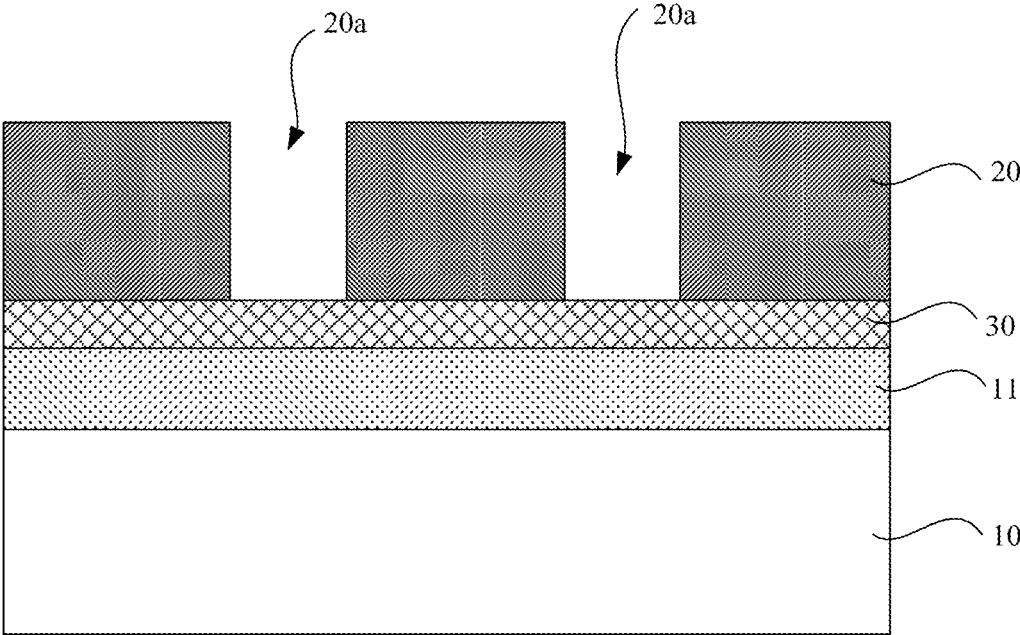

Next, referring to step S2 in FIG. 1, and as shown in FIG. 4 and FIG. 5, the silicon substrate 20 and the bonding layer 30 are patterned to respectively form several through-silicon-vias 20a and several first through-holes 30a each corresponding to one of the several through-silicon-vias. Each of the first through-holes 30a exposes the group III nitride epitaxial layer 11, and each of the through-silicon-vias 20a communicates with a corresponding first through-hole 30a.

In this embodiment, several refers to one, two or more than two.

Referring to FIG. 5, the silicon substrate 20 and the bonding layer 30 can be patterned in a one-step dry etching process; referring to FIG. 4, the silicon substrate 20 can be patterned to form through-silicon-vias 20a first, and then using the patterned silicon substrate 20 as a mask, the bonding layer 30 is dry-etched to form first through-holes 30a.

A thickness of the silicon substrate 20 is relatively thick, and a depth-to-width ratio of a through-silicon-via 20a formed therein is generally relatively large, for example, greater than 1:1.

In this embodiment, as shown in FIG. 4 and FIG. 5, when there are two or more through-silicon-vias 20a, a depth-to-width ratio of each of the two or more through-silicon-vias 20a is the same. In other embodiments, the depth-to-width ratios of respective through-silicon-vias 20a can be different.

After that, referring to step S3 in FIG. 1 and FIG. 6, the group III nitride epitaxial layer 11 is epitaxially grown to form a first semiconductor layer 41 in each first through-hole 30a and each through-silicon-via 20a and on the patterned silicon substrate 20.

In this embodiment, before the group III nitride epitaxial layer 11 is epitaxially grown, a reusable cover mask plate 50 can be disposed on the patterned silicon substrate 20 first.

The cover mask plate 50 has several openings 50a. Each opening 50a communicates with a corresponding first through-hole 30a and a corresponding through-silicon-via 20a. In other words, each opening 50a corresponds to an LED structure.

In other embodiments, the cover mask plate 50 can be replaced by a patterned mask layer remaining in the semiconductor structure 1.

A material of the patterned mask layer can include, for example, at least one of silicon dioxide or silicon nitride. The mask layer can be formed by physical vapor deposition or chemical vapor deposition, and patterns of the mask layer can be realized by dry etching or wet etching.

Epitaxial growth processes of the first semiconductor layer 41 can include: atomic layer deposition (ALD), chemical vapor deposition (CVD), molecular beam epitaxy (MBE), plasma enhanced chemical vapor deposition (PECVD), low pressure chemical vapor deposition (LPCVD), or metal-organic chemical vapor deposition (MOCVD), or a combination thereof.

Due to a large depth-to-width ratio of the through-silicon-via 20a, extensions of dislocations in the first semiconductor layer 41 can be limited, which can make more dislocations annihilate in the interior or sidewalls of the through-silicon-vias 20a, so that the first semiconductor layer 41 with low dislocation density can be formed, and the quality of the first semiconductor layer 41 is improved.

During epitaxially growing the first semiconductor layer 41, the first semiconductor layer 41 can be doped with P-type doping ions or N-type doping ions. The P-type doping ions can include at least one of magnesium (Mg) ions, zinc (Zn) ions, calcium (Ca) ions, strontium (Sr) ions or barium (Ba) ions, and the N-type doping ions can include at least one of silicon (Si) ions, germanium (Ge) ions, tin (Sn) ions, selenium (Se) ions or tellurium (Te) ions. In-situ doping method can be used, for example, doping while growing.

A material of the first semiconductor layer 41 is same as or different from a material of the group III nitride epitaxial layer 11, the material of the first semiconductor layer 41 can include at least one of GaN, AlN, AlGaN, InGaN, or AlInGaN.

In this embodiment, as shown in FIG. 6, respective openings 50a on the cover mask plate 50 are of different sizes. In this embodiment, a size of an opening 50a refers to an area size of the opening 50a.

When the depth-to-width ratios of respective through-silicon-vias 20a are different, a size ratio of each opening 50a to a communicated through-silicon-via 20a can be fixed. Because the sizes of the openings 50a are different, sizes of top surfaces of the first semiconductor layers 41 epitaxially grown in the openings 50a are different. In this embodiment, a size of the top surface of the first semiconductor layer 41 is an area of the top surface of the first semiconductor layer 41.

In other embodiments, when the sizes of the openings 50a are the same, the sizes of the top surfaces of the first semiconductor layers 41 epitaxially grown in the openings 50a are also the same.

Then, referring to step S4 in FIG. 1 and FIG. 6, an active layer 42 and a second semiconductor layer 43 are epitaxially grown on the first semiconductor layer 41 in sequence. A conductivity type of the second semiconductor layer 43 is opposite to a conductivity type of the first semiconductor layer 41, a material of the first semiconductor layer 41 include a group III nitride, a material of the active layer 42 include a group III nitride, and a material of the second semiconductor layer 43 include a group III nitride.

The first semiconductor layer 41, the active layer 42 and the second semiconductor layer 43 form an LED structure.

The active layer 42 can include wavelength-sensitive elements such as an indium (In) element or an aluminum (Al) element.

Epitaxial growth processes of the active layer 42 and the second semiconductor layer 43 can refer to epitaxial growth processes of the first semiconductor layer 41. When the first semiconductor layer 41 is doped with P-type doping ions, the second semiconductor layer 43 is doped with N-type doping ions; when the first semiconductor layer 41 is doped with N-type doping ions, the second semiconductor layer 43 is doped with P-type dopant ions.

In this embodiment, the active layer 42 and the second semiconductor layer 43 of one LED structure are formed in one opening 50a, and thus, the active layer 42 is located on the top surface of the first semiconductor layer 41.

If opening size ratios of the openings 50a of the cover mask plate 50 are different, when the active layer 42 grows, flow rates of reactive gases in the openings 50a are different, so that doping rates of the indium (In) element and the gallium (Ga) element are different, that is, the doping efficiency of the indium element is different, this makes composition ratio of the indium element in the grown active layer 42 different. In some embodiments, the smaller the opening size ratio of the opening 50a is, the faster a growth rate of a base material GaN of the active layer 42 in the opening 50a is, the doping of the indium element has better selectivity, and the doping rate of indium element is greater than the doping rate of gallium element. Therefore, the smaller the opening size ratio of the opening 50a is, the greater the composition ratio of the indium element in the active layer 42 InGaN is. In addition, the smaller the opening size ratio of the opening 50a, a thickness of a quantum well in the opening is increase accordingly. Because of the quantum Stark effect, a wavelength of light is increased accordingly. On the contrary, the larger the opening size ratio of the opening 50a is, the less the difference between the doping rate of the indium element and the doping rate of the gallium element is, that is, the lower the doping efficiency of indium element is, the less the composition ratio of the indium element in the grown active layer 42 is.

The composition ratio of the indium element refers to a percentage of an amount of an indium element to a sum of amounts of all positively charged elements in the active layer 42. For example, if the material of the active layer 42 includes InGaN, and the composition ratio of the indium element refers to the percentage of the amount of the indium element to a sum of the amount of the indium element and the amount of an gallium element; if the material of the active layer 42 includes InAlGaN, the composition ratio of the indium element refers to the percentage of the amount of the indium element to a sum of the amount of the indium element, an amount of an aluminum element and an amount of a gallium element.

In other embodiments, the active layer 42 is located on the top surface of the first semiconductor layer 41. In some embodiments, the active layer 42 and the second semiconductor layer 43 can be epitaxially grown by full/whole surface epitaxy, and then respective layers are disconnected by etching to form respective LED structures, or the first semiconductor layer 41, the active layer 42 and the second semiconductor layer 43 are epitaxially grown by full surface epitaxy, and then then respective layers are disconnected by etching to form respective LED structures.

Thereafter, referring to FIG. 7, the cover mask plate 50 is removed.

Referring to FIG. 7, the semiconductor structure 1 in the first embodiment includes:

a silicon substrate 20 and a group III nitride epitaxial layer 11 on a first substrate 10, a bonding layer 30 between the group III nitride epitaxial layer 11 and the silicon substrate 20; the group III nitride epitaxial layer 11 and the silicon substrate 20 being bonded together through the bonding layer 30; one or more through-silicon-vias 20a provided in the silicon substrate 20, one or more first through-holes 30a provided in the bonding layer 30, each of the one or more through-silicon-vias 20a being communicated with the corresponding first through-hole 30a;

a first semiconductor layer 41 located in the through-silicon-vias 20a and the first through-holes 30a and on the silicon substrate, an active layer 42 located on the first semiconductor layer 41 and a second semiconductor layer 42 located on the active layer 42, a conductivity type of the second semiconductor layer 43 being opposite to a conductivity type of the first semiconductor layer 41, a material of the first semiconductor layer 41 including a group III nitride, a material of the active layer 42 including a group III nitride, and a material of the second semiconductor layer 43 including a group III nitride.

In this embodiment, the active layer 42 is located on the top surface of the first semiconductor layer 41. The smaller the size of the top surface of the first semiconductor layer 41 is, the greater the composition ratio of the indium element in the active layer 42 is, and the longer the light emitting wavelength of the LED structure is; the larger the size of the top surface of the first semiconductor layer 41 is, the less the composition ratio of the indium element in the active layer 42 is, the shorter the light emitting wavelength of the LED structure is.

In some embodiments, there are a plurality of through-silicon-vias 20a and a plurality of first through-holes 30a, respectively, and sidewalls of the silicon substrate 20 and/or sidewalls of the group III nitride epitaxial layer 11 can be provided with a common electrode, and the common electrode is electrically coupled with the first semiconductor layer 41 in each of the plurality of through-silicon-vias 20a. The common electrode can be a ground electrode. A driving electrode can be disposed on the second semiconductor layer 43 of each LED structure.

Figure 8:
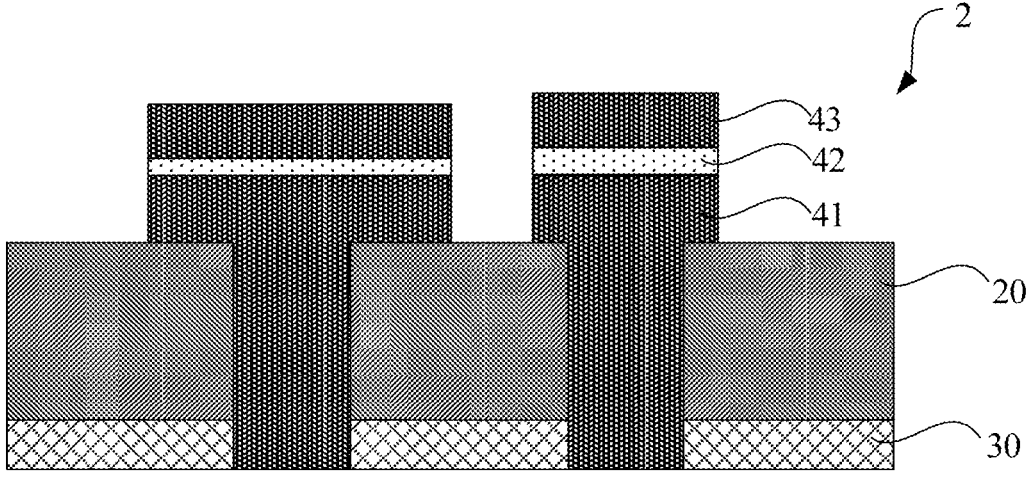
FIG. 8 is a cross-sectional structural diagram of a semiconductor structure according to a second embodiment of the present disclosure.

FIG. 8 is a cross-sectional structural diagram of a semiconductor structure according to a second embodiment of the present disclosure.

Referring to FIG. 8, the semiconductor structure 2 and the manufacturing method thereof in the second embodiment are substantially the same as the semiconductor structure 1 and the manufacturing method thereof in the first embodiment, except that the first substrate 10 and the group III nitride epitaxial layer 11 are removed.

The removal of the first substrate 10 and the group III nitride epitaxial layer 11 can be performed by etching (or corroding) the bonding layer 30 to peel off the group III nitride epitaxial layer 11 from the silicon substrate 20.

The first substrate 10 and the group III nitride epitaxial layer 11 peeled off from the silicon substrate 20 can be reused.

In this embodiment, the common electrode can be disposed on the side of the silicon substrate 20 away from the second semiconductor layer 43, and to be connected with the first semiconductor layer 41 in each of the one or more through-silicon-vias 20a.

Figure 9:
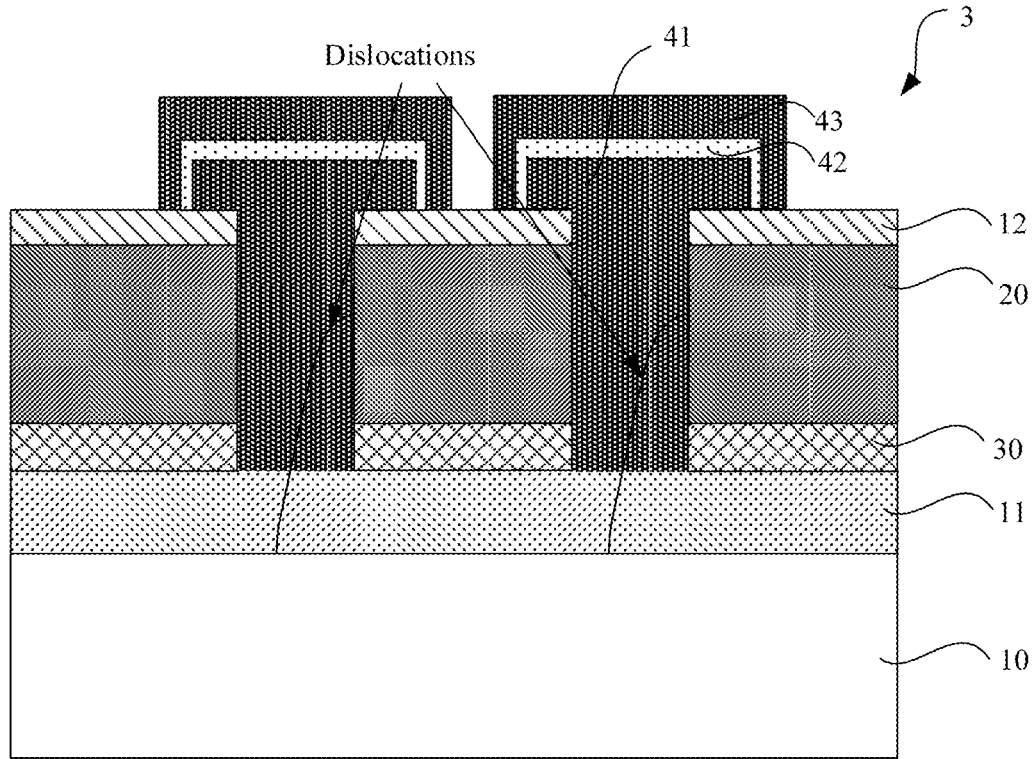
FIG. 9 is a cross-sectional structural diagram of a semiconductor structure according to a third embodiment of the present disclosure.

FIG. 9 is a cross-sectional structural diagram of a semiconductor structure according to a third embodiment of the present disclosure.

Referring to FIG. 9, the semiconductor structure 3 in the third embodiment is substantially the same as the semiconductor structure 1 and the semiconductor structure 2 in the first and second embodiments, expect that there is a dielectric layer 12 between the first semiconductor layer 41 and an upper surface of the silicon substrate 20, the active layer 42 is located on the top surface and the side surface of the first semiconductor layer 41, and the top surface and the side surface of the first semiconductor layer 41 are perpendicular to each other.

In some embodiments, a material of the dielectric layer 12 can includes at least one of a silicon dioxide, a silicon nitride, or an aluminum oxide.

Correspondingly, the manufacturing method in this embodiment is substantially the same as the manufacturing method in previous embodiments, expect that: between step S1 and step S2, forming the dielectric layer 12 on the side of the silicon substrate 20 away from the group III nitride epitaxial layer 11 is performed. The dielectric layer 12 can be formed by using physical vapor deposition, chemical vapor deposition or atomic layer deposition. In some embodiments, at step S2, the dielectric layer 12 and the silicon substrate 20 can be patterned in a same process, for example, by one-step dry etching or wet etching. In another embodiment, at step S2, the dielectric layer 12 is patterned first, and then the silicon substrate 20 is etched by using the patterned dielectric layer 12 as a mask.

Or one of differences between the manufacturing method of the present embodiment and the manufacturing method of previous embodiments is that: between step S2 and step S3, forming the patterned dielectric layer 12 on the patterned silicon substrate 20 is performed. For example, the dielectric layer 12 is formed by thermally oxidizing the silicon substrate 20.

Through material selection, the dielectric layer 12 can improve a growth performance of the first semiconductor layer 41 on the silicon substrate 20, especially on the monocrystalline silicon with <100> orientation silicon substrate 20.

In some embodiments, the dielectric layer 12 is formed on the sidewalls of the one or more through-silicon-vias 20a. The dielectric layer 12 on the sidewalls of the one or more through-silicon-vias 20a can prevent the GaN-based material of the first semiconductor layer 41 from reacting with the silicon substrate 20 when the first semiconductor layer 41 is epitaxially grown.

A second difference between the manufacturing method of the present embodiment and the manufacturing method of previous embodiments is that: between step S3 and step S4, removing the cover mask plate 50 is performed.

After removing the cover mask plate 50, the side surface of the first semiconductor layer 41 is exposed, so that the active layer 42 and the second semiconductor layer 43 can be epitaxially grown on the side surface of the first semiconductor layer 41. The active layer 42 and the second semiconductor layer 43 can be epitaxially grown by full/ whole surface epitaxy, and then respective layers can be disconnected by etching to form respective LED structures.

Figure 10:
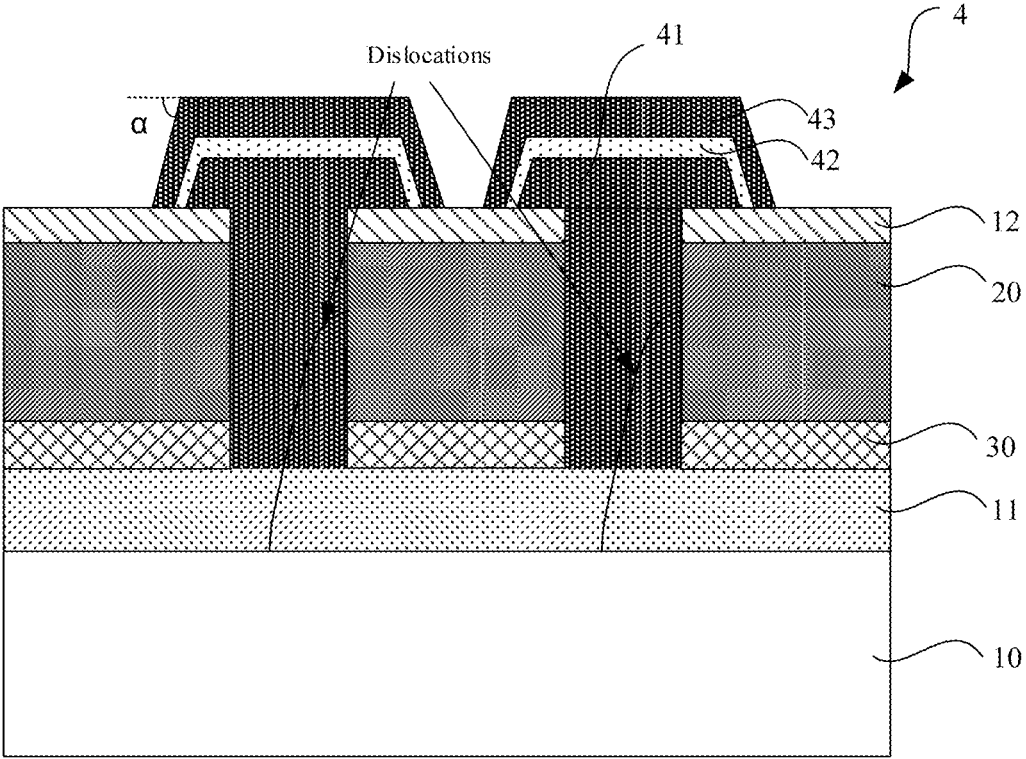
FIG. 10 is a cross-sectional structural diagram of a semiconductor structure according to a fourth embodiment of the present disclosure.

FIG. 10 is a cross-sectional structural diagram of a semiconductor structure according to a fourth embodiment of the present disclosure.

Referring to FIG. 10, the semiconductor structure 4 in the fourth embodiment is substantially the same as the semiconductor structure 3 in the third embodiment, except that: the active layer 42 is located on the top surface and the side surface of the first semiconductor layer 41, the top surface and the side surface of the first semiconductor layer 41 form an angle α, 40°≤α≤70°.

The size of the angle α between the side surface and the top surface of the first semiconductor layer 41 can be formed by process conditions of epitaxial growth or etching methods.

The larger the angle α between the side surface and the top surface is, the steeper the side surface is.

Because the top surface is (0001) crystal plane, a doping efficiency of the indium element in the active layer 42 located on the top surface is greater than a doping efficiency of the indium element in the active layer 42 located on a semipolar surface of the side surface. A composition ratio of the indium element in the active layer 42 located on the top surface is greater than a composition ratio of the indium element in the active layer 42 located on the side surface. The greater the composition ratio of the indium element is, the longer a corresponding light emitting wavelength is.

Figure 11:
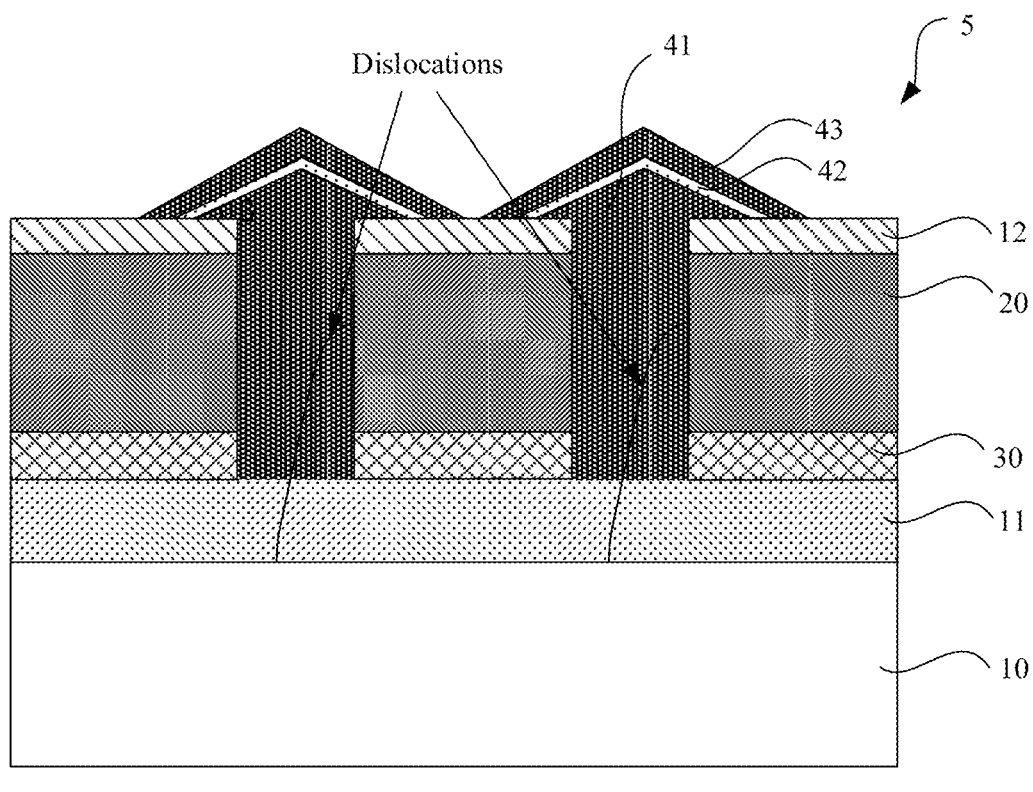
FIG. 11 is a cross-sectional structural diagram of a semiconductor structure according to a fifth embodiment of the present disclosure.

FIG. 11 is a cross-sectional structural diagram of a semiconductor structure according to a fifth embodiment of the present disclosure.

Referring to FIG. 11, the semiconductor structure 5 in the fifth embodiment is substantially the same as the semiconductor structure 4 in the fourth embodiment, expect that: a cross-section of the first semiconductor layer 41 along a thickness direction is triangular, and the active layer 42 is located on the side surface of the first semiconductor layer 41, the side surface of the first semiconductor layer 41 and an upper surface of the silicon substrate 20 form an angle β, 40°≤β≤70°.

The size of the angle β between the side surface of the first semiconductor layer 41 and the upper surface of the silicon substrate 20 can be formed by process conditions of epitaxial growth or the etching methods.

The larger the angle β between the side surface of the first semiconductor layer 41 and the upper surface of the silicon substrate 20 is, the steeper the side surface is.

In some embodiments, there are a plurality of through-silicon-vias 20a, and an arrangement of the active layer 42 located on the first semiconductor layer 41 in at least one of the plurality of through-silicon-vias 20a is different from an arrangement of the active layers 42 located on the first semiconductor layer 41 in other through-silicon-vias 20a. The arrangement of the active layer 42 on the first semiconductor layer 41 can be the arrangement of the active layer 42 in at least one of the first, second, third, fourth, or fifth embodiments.

Although the present application is disclosed above, the present disclosure is not limited thereto. One of ordinary skill in the art can make various variants and modifications to the present disclosure without departing from the spirit and scope of the present disclosure. Therefore, the protection scope of the present disclosure should be set forth by the appended claims.

The invention claimed is:

1. A semiconductor structure, comprising:
   a silicon substrate provided with one or more through-silicon-via in the silicon substrate;
   a first semiconductor layer located in each of the one or more through-silicon-vias and on the silicon substrate;
   an active layer located on the first semiconductor layer, wherein the active layer is located on a top surface of the first semiconductor layer; and
   a second semiconductor layer located on the active layer, wherein a conductivity type of the second semiconductor layer is opposite to a conductivity type of the first semiconductor layer, a material of the first semiconductor layer comprises a group III nitride, a material of the active layer comprises a group III nitride, and a material of the second semiconductor layer comprises a group III nitride;
   wherein the active layer includes an indium element; and
   wherein a composition ratio of the indium element in the active layer increases as a size of the top surface of the first semiconductor layer decreases and the composition ratio of the indium element in the active layer decreases as the size of the top surface of the first semiconductor layer increases.

2. The semiconductor structure of claim 1, wherein a dielectric layer is disposed between the first semiconductor layer and an upper surface of the silicon substrate.

3. The semiconductor structure of claim 2, wherein the active layer is located on a top surface and a side surface of the first semiconductor layer.

4. The semiconductor structure of claim 3, wherein
   an angle between the side surface and the top surface ranges from 40° to 70°;
   the composition ratio of the indium element in the active layer located on the top surface is greater than the composition ratio of the indium element in the active layer located on the side surface.

5. The semiconductor structure of claim 2, wherein a cross section of the first semiconductor layer along a thickness direction is triangular, and the active layer is located on a side surface of the first semiconductor layer.

6. The semiconductor structure of claim 1, wherein a depth-to-width ratio of each of the one or more through-silicon-vias is greater than 1:1.

7. The semiconductor structure of claim 1, wherein there is a plurality of through-silicon-vias, a common electrode is disposed on a side of the silicon substrate away from the second semiconductor layer, and the common electrode is electrically coupled with the first semiconductor layer in each of the through-silicon-vias.

8. The semiconductor structure of claim 1, further comprising:
   a group III nitride epitaxial layer located on a first substrate,
   a bonding layer bonding the group III nitride epitaxial layer and the silicon substrate together, and
   one or more first through-holes provided in the bonding layer, each of the one or more first through-holes communicating with a corresponding through-silicon-via, the first semiconductor layer being located in the one or more first through-holes to connect with the group III nitride epitaxial layer.

9. The semiconductor structure of claim 8, wherein there are a plurality of through-silicon-vias and a plurality of first through-holes respectively, a common electrode is provided on one or both of a sidewall of the silicon substrate or a sidewall of the group III nitride epitaxial layer, and the common electrode is electrically coupled with the first semiconductor layer in each of the through-silicon-vias.

10. A method of manufacturing a semiconductor structure, comprising:

providing a silicon substrate, providing a group III nitride epitaxial layer located on a first substrate; and providing a bonding layer between the group III nitride epitaxial layer and the silicon substrate, the group III nitride epitaxial layer and the silicon substrate being bonded together through the bonding layer;

patterning the silicon substrate and the bonding layer to respectively form one or more through-silicon-vias and one or more first through-holes each corresponding to one of the one or more through-silicon-vias, each of the one or more first through-holes exposing the group III nitride epitaxial layer, each of the one or more through-silicon-vias communicating with a corresponding first through-hole;

epitaxially growing the group III nitride epitaxial layer to form a first semiconductor layer in each of the one or more first through-holes and each of the one or more through-silicon-vias and on the patterned silicon substrate; and epitaxially growing an active layer and a second semiconductor layer on the first semiconductor layer in sequence, a conductivity type of the second semiconductor layer being opposite to a conductivity type of the first semiconductor layer, a material of the first semiconductor layer comprising a group III nitride, a material of the active layer comprising a group III nitride, and a material of the second semiconductor layer comprising a group III nitride.

11. The method of manufacturing the semiconductor structure of claim 10, wherein the active layer is formed on a top surface of the first semiconductor layer by etching or using a mask layer.

12. The method of manufacturing the semiconductor structure of claim 11, wherein the active layer comprises an indium element; the smaller a size of the top surface of the first semiconductor layer is, the greater a composition ratio of the indium element in the active layer is; and the larger the size of the top surface of the first semiconductor layer is, the less the composition ratio of the indium element in the active layer is.

13. The method of manufacturing the semiconductor structure of claim 10, further comprising: before epitaxially growing the first semiconductor layer, forming a patterned dielectric layer on the patterned silicon substrate.

14. The method of manufacturing the semiconductor structure of claim 10, further comprising:

before patterning the silicon substrate to form the one or more through-silicon-vias, forming a dielectric layer on a side of the silicon substrate away from the group III nitride epitaxial layer;

patterning the dielectric layer and the silicon substrate in a same process; or patterning the dielectric layer, and etching the silicon substrate by using the patterned dielectric layer as a mask.

15. The method of manufacturing the semiconductor structure of claim 13, further comprising: forming the active layer on a top surface and a side surface of the first semiconductor layer.

16. The method of manufacturing the semiconductor structure of claim 15, wherein the active layer comprises an indium element; the larger an angle between the side surface and the top surface is, the less a composition ratio of the indium element in the active layer on the side surface is; and the smaller the angle between the side surface and the top surface is, the greater the composition ratio of the indium element in the active layer on the side surface is.

17. The method of manufacturing the semiconductor structure of claim 15, wherein a cross section of the first semiconductor layer along a thickness direction is triangular, and the method further comprising: forming the active layer on the side surface of the first semiconductor layer.

18. The method of manufacturing the semiconductor structure of claim 10, further comprising: etching the bonding layer to peel off the group III nitride epitaxial layer from the silicon substrate.

* * * * *